(12) United States Patent
Schmitt et al.

(10) Patent No.: US 10,701,845 B2
(45) Date of Patent: Jun. 30, 2020

(54) SHIELD ASSEMBLY FOR AN ELECTRONIC COMPONENT

(71) Applicant: Apple Inc., Cupertino, CA (US)

(72) Inventors: Griffin L. Schmitt, Sunnyvale, CA (US); Benjamin S. Bustle, Cupertino, CA (US); Kevin M. Froese, San Francisco, CA (US); Lucy E. Browning, San Francisco, CA (US); Zhipeng Zhang, Santa Clara, CA (US); Jaden A. Barney, Charlotte, NC (US); Nan Li, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/262,763

(22) Filed: Jan. 30, 2019

(65) Prior Publication Data

US 2020/0100402 A1    Mar. 26, 2020

Related U.S. Application Data

(60) Provisional application No. 62/736,319, filed on Sep. 25, 2018.

(51) Int. Cl.
*H05K 9/00* (2006.01)
*H05K 5/00* (2006.01)
*H05K 5/03* (2006.01)
*H05K 5/02* (2006.01)

(52) U.S. Cl.
CPC ......... *H05K 9/0007* (2013.01); *H05K 5/0086* (2013.01); *H05K 5/0217* (2013.01); *H05K 5/03* (2013.01)

(58) Field of Classification Search
None
See application file for complete search history.

(56) References Cited

U.S. PATENT DOCUMENTS

| 4,833,276 | A | 5/1989 | Ito |
| 5,774,344 | A * | 6/1998 | Casebolt .............. H05K 9/0037 174/51 |
| 6,137,051 | A | 10/2000 | Bundza |
| 6,239,359 | B1 | 5/2001 | Lilienthal, II et al. |
| 6,426,881 | B1 | 7/2002 | Kurz |
| 6,501,030 | B1 | 12/2002 | Parizi et al. |
| 6,524,120 | B2 | 2/2003 | Zhao |
| 7,239,507 | B1 | 7/2007 | Kim |
| 7,563,992 | B2 | 7/2009 | Lawlyes et al. |

(Continued)

*Primary Examiner* — Xanthia C Cunningham
(74) *Attorney, Agent, or Firm* — Morgan, Lewis & Bockius LLP (57) ABSTRACT

A shield assembly can enclose an electronic component in a chamber of a mobile communication device. The shield assembly can include a chassis having a slot and a conductive rail adjacent to the slot. A covering can be mounted over the electronic component and coupled to the chassis via a spring contact disposed in the slot. The covering can include a shield element configured to cover a chamber enclosing the electronic component. The covering can further include a first tab connected to the shield element, and a second tab connected to the shield element and spaced apart from the first tab by a gap. A spring contact can be disposed in the gap and electrically connected to the shield element via at least one of the first tab and the second tab.

20 Claims, 6 Drawing Sheets

(56) References Cited

U.S. PATENT DOCUMENTS

| | | | | |
|---|---|---|---|---|
| 8,922,980 | B2* | 12/2014 | Allore | H04M 1/026 |
| | | | | 361/679.01 |
| 9,844,158 | B2* | 12/2017 | Shi | H04M 1/0262 |
| 9,924,007 | B2* | 3/2018 | Hyun | H04M 1/236 |
| 2005/0032426 | A1 | 2/2005 | Tanaka | |
| 2007/0139904 | A1 | 6/2007 | English et al. | |
| 2016/0088132 | A1* | 3/2016 | Kranz | H02J 7/00 |
| | | | | 340/573.1 |

* cited by examiner

SHIELD ASSEMBLY FOR AN ELECTRONIC COMPONENT

CROSS-REFERENCE TO RELATED APPLICATIONS

This application claims the benefit of U.S. Provisional Application No. 62/736,319, entitled "SHIELD ASSEMBLY FOR AN ELECTRONIC COMPONENT," filed Sep. 25, 2018, the entirety of which is incorporated herein by reference.

TECHNICAL FIELD

The present description relates generally to an electronic device, and, more particularly, to a shield assembly for an electronic component in a mobile communication device.

BACKGROUND

Portable electronic devices can include a housing to enclose electronic components such as, for example, a circuit board, a display, a battery, a camera, and/or other sensors. Increasingly, portable electronic devices are made thinner and smaller for improved portability and/or aesthetic design. At the same time, additional components and larger components are increasingly being integrated into portable electronic devices to allow for new functionalities and/or to provide for improved functionality. However, the desire for thinner and smaller devices, new functionalities, and/or improved functionalities makes it challenging to integrate the various components within a common device housing or assembly while maintaining optimum performance of the various components.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

The following disclosure relates to an electronic device, such as a mobile communication device that takes the form of a smart phone or a tablet computer device. According to some embodiments, the electronic device can include multiple operative electronic components mounted to a chassis or assembled within a common enclosure. The electronic device can utilize a shield assembly to shield an electronic component, such as a camera, to block or reduce electric fields that could emanate to or from the electronic component and cause electrical interference with respect to other electronic components included in a region or area nearby or proximate to the shielded component.

The shield assembly can include a covering mounted to a conductive chassis and mounted over the electronic component. A retention feature on the covering can cooperate with a mounting fixture of the chassis to provide for mechanical and electrical coupling that serves to retain the covering and the electronic component in place, while also maintaining a grounding condition on the covering based on electrical coupling contact at the retention feature and mounting fixture interface.

The retention feature can utilize a spring contact disposed between a pair of tabs so that, when the tabs are inserted into a complementary slot of the mounting fixture, the tabs can provide structural retention of the shield against the electronic component, while the spring contact can provide for a mechanically robust way to maintain electrical coupling contact to the chassis via a conductive rail surrounding or otherwise adjacent to the slot. By positioning the spring contact between the tabs using a relatively thinner conductive plate welded to the tabs, the tabs can be made sufficiently thick while the spring contact plate can be made sufficiently thin within what may be a constrained thickness or Z-height in the device. The relatively thicker tabs can provide for mechanical retention while the relatively thinner spring plate can provide for electrical connection without an unduly high spring stiffness that would result from the thickness of the mechanical retention tabs. Thus, a grounded shield assembly can be provided for an electronic component in what may be a relatively small or thin overall electronic device structure.

These and other embodiments are discussed below with reference to FIGS. 1-6B. However, those skilled in the art will readily appreciate that the detailed description given herein with respect to these Figures is for explanatory purposes only and should not be construed as limiting.

Figure 1:
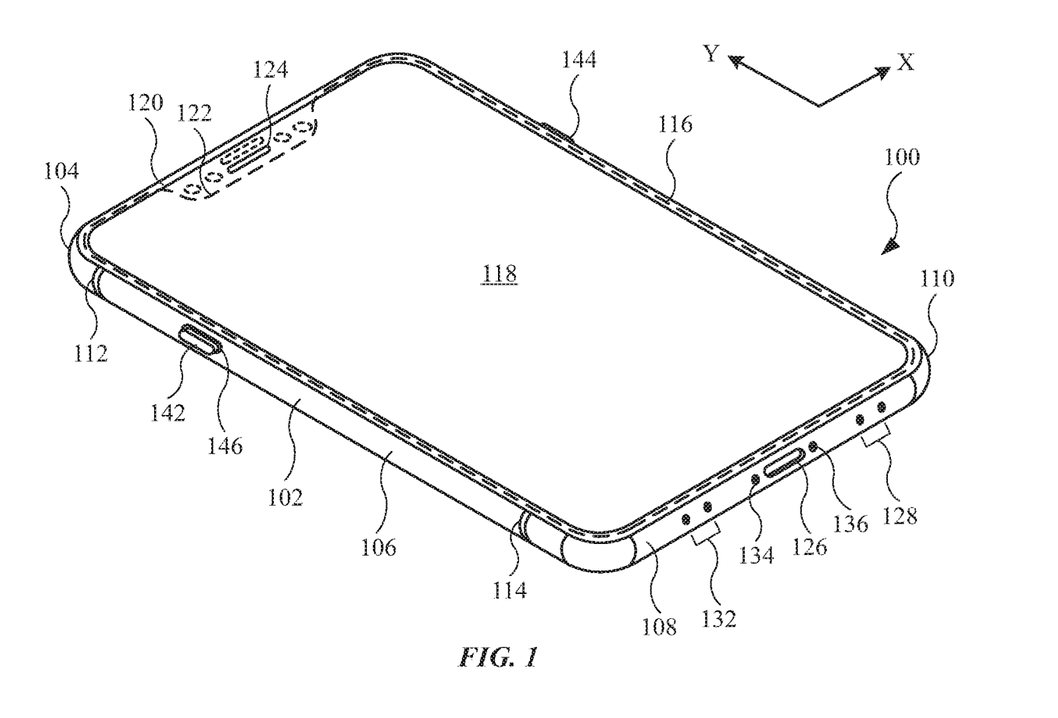
FIG. 1 illustrates a front isometric view of an example of an electronic device, in accordance with some embodiments.

FIG. 1 illustrates a front isometric view of an example of an electronic device 100, in accordance with some embodiments. The electronic device 100 generally includes multiple electronic components mounted to a chassis within an enclosure. According to some embodiments, one or more of the electronic components can be mounted to the chassis using a shield assembly that can serve to mitigate electromagnetic field interference, as further described below.

In the example shown in FIG. 1, the electronic device 100 is implemented as a mobile communication device (a smartphone, for example). However, it is contemplated that teachings relating to the mobile communication device can be applied to any of a variety of electronic devices. Examples of electronic devices include tablet computers, laptop computers, cellular phones, portable music players, video game consoles, digital media players, smart speakers, and wearable electronic devices (such as smart watches and activity trackers).

The electronic device 100 can include a sidewall 102 that defines an outer perimeter of the electronic device 100. The sidewall 102 can include conductive materials, non-conductive materials (also referred to herein as "insulating" or "dielectric" materials), or combinations thereof. For example, the sidewall 102 can include a conductive metal, such as aluminum, stainless steel, or an alloy that includes at least one of aluminum or stainless steel. Additionally or alternatively, the sidewall 102 can include non-conductive materials, such as glass, ceramic, plastic, resin, or any combination thereof.

With reference to the illustrated example shown in FIG. 1, the sidewall 102 can be composed of multiple sidewall components, such as a first sidewall component 104, a second sidewall component 106, a third sidewall component 108 (positioned opposite the first sidewall component 104), and a fourth sidewall component 110 (positioned opposite to the second sidewall component 106). The aforementioned sidewall components may include any material(s) previously described for the sidewall 102. In some embodiments, some of the sidewall components form part of an antenna assembly. As a result, a non-conductive material, or materials, may separate conductive sidewall components of the sidewall 102 from each other in order to electrically isolate the sidewall components.

For example as shown in FIG. 1, a first insulating divider 112 can separate the first sidewall component 104 from the second sidewall component 106, and a second insulating divider 114 can separate the second sidewall component 106 from the third sidewall component 108, where each of the first sidewall component 104, the second sidewall component 106, and the third sidewall component 108 are made from or otherwise include conductive materials that act as an antenna or part of an antenna. However, while the example is described with reference to conductive sidewall components that may form part of an antenna assembly or otherwise provide an electrical function of the electronic device 100, other implementations are contemplated in which non-conductive materials are used for any one or more of the sidewall components. Additionally or alternatively, implementations are contemplated in which any two or more of the sidewall components can be integrally formed of a single piece.

With continued reference to FIG. 1, the electronic device 100 may further include a display component 116 (shown as a dotted line) that is covered by a front protective cover 118. The front protective cover 118 may be formed from a transparent material, such as glass, plastic, sapphire, or the like. In this regard, the front protective cover 118 may be referred to as a transparent cover, a transparent protective cover, or a cover glass (when the front protective cover 118 includes glass). As shown in FIG. 1, the front protective cover 118 can include an opening 124 to facilitate transmission of acoustical energy (in the form of audible sound) into the electronic device 100, which may be received by an audio component such as microphone of the electronic device 100. Additionally or alternatively, the opening 124 may facilitate transmission of acoustical energy (in the form of audible sound) out the electronic device 100, which may be generated by an audio component such as speaker of the electronic device 100.

The display component 116 may include a display panel, such as a liquid crystal display (LCD), organic-light emitting diode (OLED), microLED panel, or any other appropriate electronic display panel or display device capable of presenting a graphic on or through the front protective cover 118. The display component 116 can include multiple layers, such as supporting substrates, thin-film transistor (TFT) layer(s), pixel circuits, capacitive or touch sensing layers, optical layers such as polarizers, light emitting diode(s) or other light emitters, and/or other electronic, optical, and/or structural components that can provide an operative display interface or touch screen display interface.

In the example shown in FIG. 1, the display component 116 is partially covered by a border 120, or frame, that extends along an outer edge of the front protective cover 118 and partially covers an outer edge of the display component 116. The border 120 can be positioned to hide or obscure any electrical and mechanical connections between the layers of the display component 116 and flexible circuit connectors. Alternatively, other implementations are contemplated in which, for example, the border 120 does not overlap with the display component 116, or in which the border 120 is omitted to provide for a display component 116 that can be viewed at or around the sidewall 102.

In the example shown in FIG. 1, the display component 116 also includes a notch 122, which is a void in the display component 116. The notch 122 may accommodate other electronic components, such as one or more audio components and/or optical components. Alternatively, other implementations are contemplated in which the notch 122 is omitted, such as, for example, implementations where the other electronic components are instead included in a thicker border region or hidden behind the display component 116.

The electronic device 100 can further include a port 126. The port 126 can provide an interface for an internal connector component that is configured to receive an external connector of a cable to allow for transfer of power and/or data signals to and/or from the electronic device 100. For example, the port 126 can be configured to communicate data information from the electronic device 100 to an external electronic device (send), to communicate data information from an external electronic device to the electronic device 100 (receive), to provide electrical energy from an external power source to the electronic device 100 (e.g., to charge a battery of the electronic device 100), and/or to provide electrical energy from a battery of the electronic device 100 to charge an external battery of an external electronic device. Accordingly, the port 126 can include or be coupled to a connector interface having one or more terminals that electrically couple to the external connector.

The electronic device 100 can further include one or more other openings. For example as shown in FIG. 1, the electronic device 100 can include one or more speaker openings 128 that allow a speaker component of the electronic device 100 to emit acoustical energy out of the electronic device 100. Additionally or alternatively, the electronic device 100 can include one or more microphone openings 132 that allow an additional microphone component of the electronic device to receive acoustical energy. Also, the electronic device 100 may include one or more fastener openings, such as a first fastener opening 134 and a second fastener opening 136 designed to permit a screw or other fastener to secure with a rail (not shown in FIG. 1) that is coupled to the front protective cover 118. In this regard, the first fastener opening 134 and the second fastener opening 136 are designed to facilitate coupling of the front protective cover 118 with the sidewall 102.

The electronic device 100 can further include one or more control inputs designed to provide a command to the electronic device 100. For example as shown in FIG. 1, the electronic device 100 can include a first control input 142 and a second control input 144. The aforementioned control inputs may be used to adjust the visual information presented on the display component 116 or the volume of acoustical energy output by an audio component, as non-limiting examples. The controls may include one of a switch or a button designed to generate a command to a processor circuit (not shown in FIG. 1). The control inputs may at least partially extend through openings in the sidewall components. For example, the second sidewall component 106 may include an opening 146 that receives the first control input 142.

Figure 2:
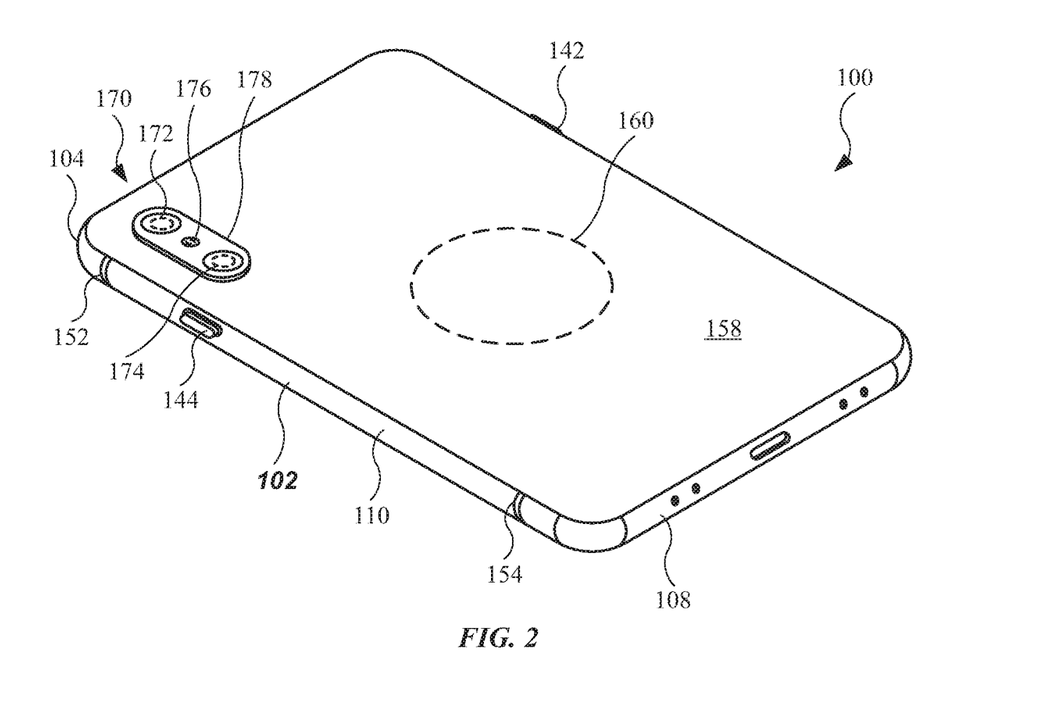
FIG. 2 illustrates a rear isometric view of the electronic device of FIG. 1.

FIG. 2 illustrates a rear isometric view of the electronic device 100 shown in FIG. 1. As shown, a third insulating divider 152 can separate the first sidewall component 104 from the fourth sidewall component 110, and a fourth insulating divider 154 separates the fourth sidewall component 110 from the third sidewall component 108.

The electronic device 100 may further include a rear protective cover 158 that couples with the sidewall 102. In this regard, the sidewall 102 may combine with the rear protective cover 158 and the front protective cover 118 to form an enclosure of the electronic device 100, with the enclosure (sidewall 102, front protective cover 118, and rear protective cover 158) defining an internal volume that encloses several internal electronic components, such as one or more batteries, circuit boards, and/or cameras, as non-limiting examples. The rear protective cover 158 may include any material(s) previously described.

In some embodiments, the rear protective cover 158 includes a non-conductive material to support wireless charging. For example, the electronic device 100 can include a wireless power receiving component 160 (represented by a dotted line) covered by the rear protective cover 158. The wireless power receiving component 160 is configured to receive an induced current when exposed to an alternating electromagnetic field. Also, the front protective cover 118 (shown in FIG. 1) may be referred to as a "front protective cover" and the rear protective cover 158 may be referred to as a "rear protective cover," because it is contemplated that in the example shown in FIG. 1, the display component 116 (which is covered by the front protective cover 118) can provide a primary graphical user interface viewed by the user through the front protective cover 118 and with which the user can interact, while the rear protective cover 158 may face away from the user during this interaction and support ancillary functions, such as photo capture and/or wireless charging. However, it is contemplated that numerous other arrangements and configurations are possible, and teachings relating to the enclosure can be applicable to implementations where the electronic device 100 is curved, flexible, and/or foldable, the electronic device 100 is provided with a wraparound and/or 360-degree display, or a display component is omitted entirely.

With continued reference to FIG. 2, the electronic device 100 can further include a camera component 170, which is an electronic component that can be included in the electronic device to provide for image capture functionality (e.g., capture of photographs and/or videos). The camera component 170 can include an image sensor, such as a silicon integrated circuit (IC) having an array of photodiodes or other light-sensitive pixels. The camera component 170 can also include a lens assembly configured to focus an image onto the image sensor.

In the example shown in FIG. 2, the camera component 170 is implemented as a rear-facing dual camera module which includes a first camera module 172, a second camera module 174, and a light emitter 176 positioned between the first camera module 172 and the second camera module 174. The first camera module 172 can, for example, include a first respective image sensor and respective lens, while the second camera module 174 can include a second respective image sensor and respective lens. The light emitter 176 is configured to provide additional lighting during an image capture event by the first camera module 172 and/or the second camera module 174. Also, the camera component 170 can further include a protective cover 178 formed from a transparent material that covers the first camera module 172, the second camera module 174, and/or the light emitter 176. Although the camera component 170 is shown with a rear-facing and dual camera arrangement, it will be appreciated that the teachings relating to a camera component are applicable to any of a variety of other configurations or arrangements, such as, for example, single camera implementations, front facing implementations or implementations facing other directions, and/or implementations in which the light emitter is omitted from the camera component or provided separately.

Figure 3:
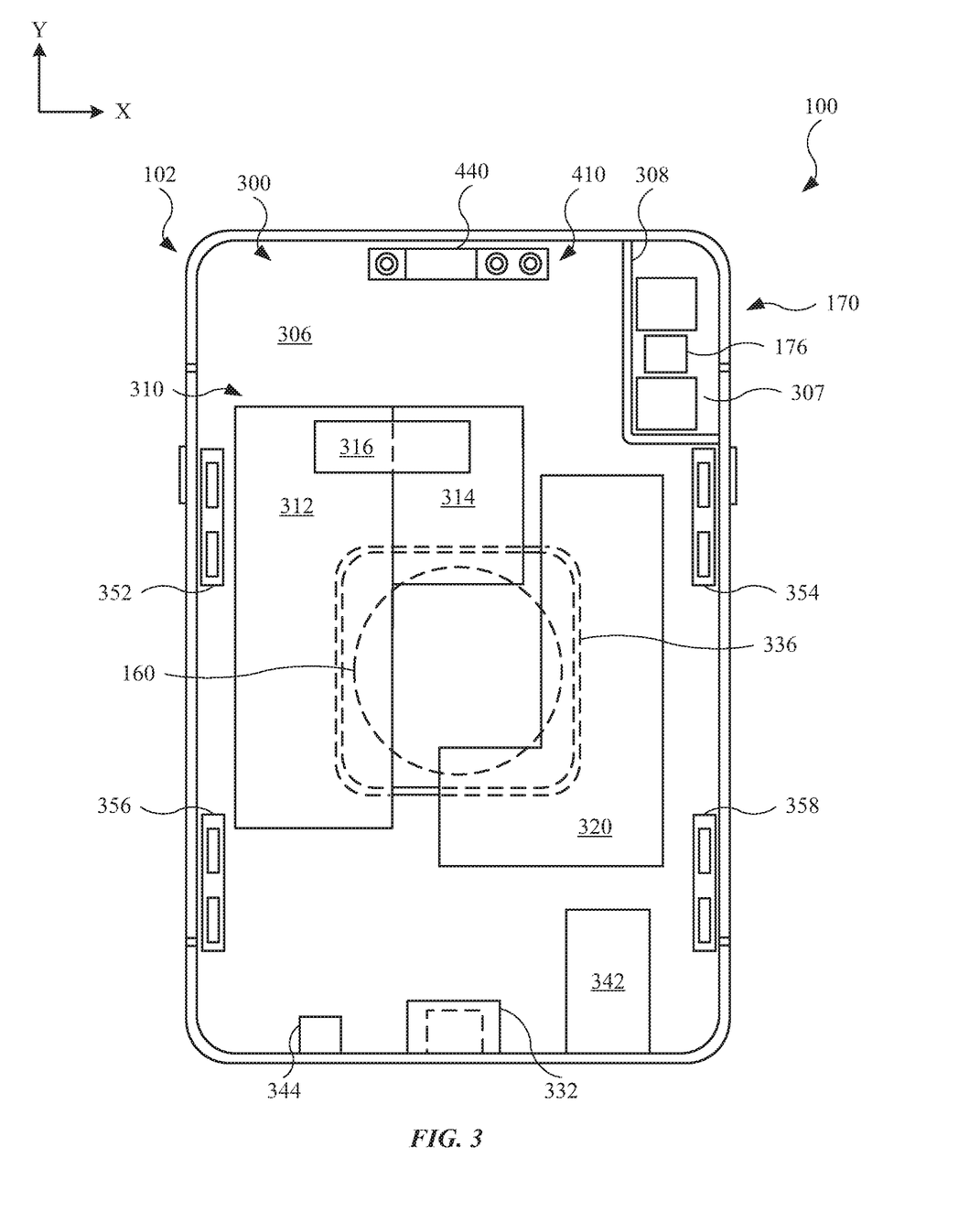
FIG. 3 illustrates a plan view of the electronic device of FIG. 1, with the display component and the front protective cover removed.

FIG. 3 illustrates a front plan view of the electronic device 100 as shown in FIG. 1, with the display component 116 and the front protective cover 118 removed. An example of a layout of several electronic components that can be disposed in the internal volume is shown. For purposes of simplicity and illustration, electronic interconnection components, such as flexible circuits, wires, cables, etc., that can be provided to provide to interconnection between various internal components are removed. As seen in FIG. 3, various electronic components may be assembled together in the electronic device 100 in proximity to one another, which may result in electromagnetic interference among the various components. As such, one or more of the electronic components can be mounted to the chassis using a shield assembly that can serve to mitigate the electromagnetic field interference, as further described below.

As shown, the electronic device 100 may include a vision component 410 and a bracket assembly 440 used to carry the vision component 410. The vision component 410 may provide the electronic device 100 with information related to object recognition, such as facial recognition. The bracket assembly 440 is designed to maintain a fixed distance between the optical components of the vision component 410.

The electronic device 100 may further include a chassis 306. The chassis 306 can generally provide a structural support and a mounting structure for one or more components of the electronic device 100 to secure the components in place with respect to the chassis 306. The chassis 306 can, for example, have a unibody construction formed of a single integral piece, or be formed of multiple discrete pieces fixedly attached together, for example. In some embodiments, chassis 306 can be implemented as the enclosure or part of the enclosure that also serves to define an internal volume and house internal components therein. For example, in some embodiments the chassis 306 can include the sidewall 102 or one or more of the sidewall components described above. Additionally or alternatively, the chassis 306 can be attached to the enclosure directly or indirectly. The chassis 306 or any constituent components of the chassis 306 can be made from or may otherwise include a rigid material, such as a metal. Also, the chassis 306 can provide an electrical grounding path for components electrically connected to the chassis. For example, the chassis 306 may include or be electrically connected to the sidewall 102 or to a conductive component of the sidewall 102.

As shown in FIG. 3, the chassis 306 can include an interior wall 308. The interior wall 308 may combine with the sidewall 102 to surround the camera component 170 and enclose the camera component 170 within a chamber 307. Walls of the chassis 306, including the interior wall 308 and/or the sidewall 102 may provide a conductive shielding element, such as a grounded structure, that provides an electromagnetic field blocking structure to mitigate electromagnetic field interference that can affect the camera component 170 and/or surrounding electronic components disposed within the internal volume 300. More generally, the conductive shielding elements that enclose or surround the chamber 307 can serve to block electromagnetic field interference between the camera component 170 or other electronic component mounted within the chamber, and one or more electronic components mounted outside the chamber. Additionally or alternatively, the interior wall 308 may provide a light blocking structure that limits or prevents light generated from the light emitter 176 from further entering an internal volume 300.

The electronic device 100 may further include a battery component 310 disposed in the internal volume. In various implementations, the battery component 310 can include a single battery or multiple batteries. In the example shown in FIG. 3, the battery component 310 includes multiple batteries including a first battery 312 coupled with a second battery 314 by coupling member 316. The coupling member 316 may include an adhesive material. Both the first battery 312 and the second battery 314 are designed to generate electrical energy that can be used by several aforementioned electronic components in the internal volume 300.

The shape of the battery component 310 may accommodate other components. For example, the electronic device 100 may further include a circuit board component 320. The circuit board component 320 may include a single circuit board or multiple circuit boards in a stacked configuration. The circuit board component 320 may include several active components (such as integrated circuits) that provide the processing for the electronic device 100.

The electronic device 100 may further include a dock component 332 in a location corresponding to the port 126 (shown in FIG. 1). The dock component 332 may include terminals and other electrical connection points (not visible in FIG. 1). The dock component 332, in conjunction with the port 126, can receive an external connector (e.g., on a cable), thereby allowing the electronic device to send and/or receive power and/or data transmission. Also, the dock component 332 can receive electrical energy used to recharge the battery component 310.

Moreover, the electronic device 100 may further include a wireless power receiving component 160 designed to provide electrical energy to the battery component 310. The wireless power receiving component 160 may include a receiver coil (not shown in FIG. 3) designed to receive an induced current by an alternating electromagnetic field generated by a transmitter coil (not shown) that is external with respect to the electronic device 100. Also, the chassis 306 may include an opening 336 (defined by a void in the chassis 306) such that the chassis 306 does not impede the alternating electromagnetic field.

The electronic device 100 may further include a first audio component 342, such as a speaker component designed to generate acoustical energy in the form of audible sound. The electronic device 100 may further include a second audio component 344, such as a microphone component designed to receive acoustical energy. Also, the electronic device may further include several rail clips designed to receive rails secured to the front protective cover 118 (shown in FIG. 1). For example, the electronic device 100 may include a first rail clip 352, a second rail clip 354, a third rail clip 356, and a fourth rail clip 358. The rails can be designed to couple with the aforementioned rail clips, as will be shown below.

Figure 4:
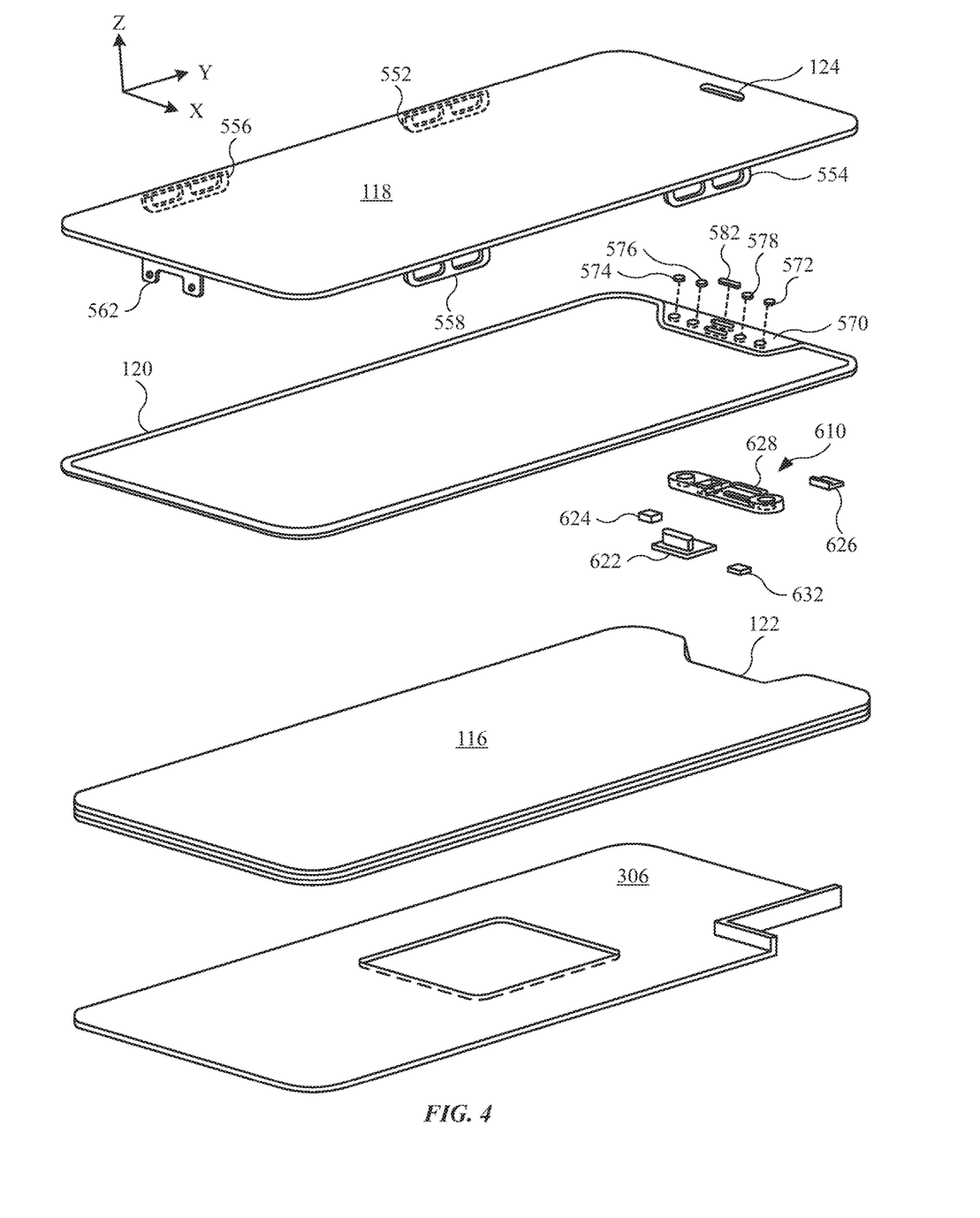
FIG. 4 illustrates an exploded view of the front protective cover and the display component of the electronic device of FIG. 1, as well as several additional components of the electronic device.

FIG. 4 illustrates an exploded view of the front protective cover 118 and the display component 116, as well as several additional components of the electronic device 100 (shown in FIG. 1). It will be appreciated from the example shown in FIG. 4 that various electronic components may not only be laid out adjacent to each other two-dimensionally (along the X-Y plane), but may also be stacked on top of or overlying each other three-dimensionally (along the Z-axis). According to some embodiments, a shield assembly as further described herein may be used to mitigate electromagnetic interference between components assembled next to or in proximity to each other in a two-dimensional layout (e.g., along the X-Y plane shown in FIG. 4). Additionally or alternatively, the shield assembly may be used to mitigate electromagnetic interference between components assembled on top of or in proximity to each other in a three-dimensional stack up (e.g., along the Z-axis shown in FIG. 4).

As shown, the front protective cover 118 may include several rails designed to secure the front protective cover 118. For example, the front protective cover 118 may include a first rail 552, a second rail 554, a third rail 556, and a fourth rail 558 designed to couple with the first rail clip 352, a second rail clip 354, a third rail clip 356, and a fourth rail clip 358, respectively, shown in FIG. 3. Also, the front protective cover 118 may further include a fifth rail 562 designed to receive fasteners, such as screws (e.g., through the first fastener opening 134 and the second fastener opening 136 shown in FIG. 1).

The border 120 may secure with a surface (such as an internal surface) of the front protective cover 118. In addition to the border 120 hiding or obscuring electrical and mechanical connections to the display component 116, additional layers may be used to hide or obscure some features. For example, an electronic device described herein may include a masking layer 570 designed to at least partially hide or obscure the vision component 410 and the bracket assembly 440. The masking layer 570 may include an opaque material designed to block light, including visible light, UV light, and IR light. The opaque material may include an ink material that is adhered to a surface of the front protective cover 118. Also, the masking layer 570 may include an appearance, in terms of color and reflectivity, designed to match that of the border 120. For example, when the border 120 includes a black or white appearance (as non-limiting examples), the masking layer 570 may include a black or white appearance, respectively.

In order to allow the vision component 410 to provide object recognition, the masking layer 570 may include several openings (not labeled). However, at least some of the openings may be covered or filled by a material that is semi-opaque. For example, an electronic device described herein may include a layer 572 that covers an opening of the masking layer 570, a layer 574 that covers an additional opening of the masking layer 570, and a layer 576 that covers another additional opening of the masking layer 570. In some embodiments, the layer 572, the layer 574, and the layer 576 include an appearance, in terms of color and/or reflectivity, similar to that of the masking layer 570 (and accordingly, an appearance, in terms of color and/or reflectivity, similar to that of the border 120). However, the layer 572, the layer 574, and the layer 576 may be designed to filter out some light in some frequencies while selectively transmitting light in other frequencies. For example, the layer 572, the layer 574, and the layer 576 may block visible light (as well as other light), and allow IR light to permeate. As a result, the layer 572, the layer 574, and the layer 576 may be referred to as visible light filters. The layer 572, the layer 574, and the layer 576 may cover components of the vision component 410 designed to transmit/emit IR light or receive IR light. A light component 624 may also be aligned with a visible light filter.

Further, an electronic device described herein may include a layer 578 that covers an additional opening of the masking layer 570, and a layer 582 that covers another additional opening of the masking layer 570. In some embodiments, the layer 578 and the layer 582 include an appearance, in terms of color and/or reflectivity, similar to that of the masking layer 570 (and accordingly, an appearance, in terms of color and/or reflectivity, similar to that of the border 120). However, the layer 578 and the layer 582 may be designed to filter out some light in some frequencies while selectively transmitting light in other frequencies. For example, the layer 578 and the layer 582 may block IR light (as well as other light), and allow visible light to permeate. As a result, the layer 578 and the layer 582 may be referred to as IR light filters. The layer 578 and the layer 582 may cover components of the vision component 410 designed to receive visible light. An ambient light sensor component 626 may also be aligned with an IR light filter.

In some instances, the bracket assembly 440 and the vision component 410 are not affixed in the electronic device 100 (shown in FIG. 1). For example, the bracket assembly 440 (along with the vision component 410) may be placed in the internal volume 300 and allowed to generally move freely with respect to, for example, the chassis 306 and the sidewall 102. However, as the front protective cover 118 is coupled with the sidewall 102 (by way of the rails securing with the rail clips), the position of the bracket assembly 440 and the vision component 410 can be adjusted to a desired location in the internal volume 300, and compressive forces can retain the bracket assembly 440 and the vision component 410 in a desired location.

In this regard, an electronic device described herein may include an alignment module 610 that is coupled with the front protective cover 118. In some instances, the masking layer 570, along with the light filter layers described above, is positioned between the front protective cover 118 and the alignment module 610. The alignment module 610 may be coupled with the front protective cover 118 in a location such when the front protective cover 118 is assembled with the enclosure (or with the remaining portion of an electronic device), the alignment module 610 guides the modules of the vision component 410 such that the modules align with a desired light filter layer described above.

An electronic device described herein may further include an audio component 622 designed to generate acoustical energy. The audio component 622 may be seated on the alignment module 610 such that the audio component 622 is aligned with the opening 124 of the front protective cover 118.

An electronic device described herein may further include light component 624 designed to generate light, such as IR light. The light component 624 may be part of or be used in conjunction with the vision component 410. For example, the light component 624 may provide additional IR light under conditions of relatively low light. The alignment module 610 may align the light component 624. An electronic device described herein may further include an ambient light sensor component 626 designed to detect an amount of light external with respect to the electronic device. In some instances, the ambient light sensor component 626 provides light conditions (such as low-light conditions) that can be used to activate the light component 624. The alignment module 610 may include a rail 628 used to align the ambient light sensor component 626. Also, an electronic device described herein may further include a microphone component 632 designed to receive acoustical energy. The microphone component 632 may be at least partially aligned with the opening 124 of the front protective cover 118.

In the example shown in FIG. 4, the notch 122 (in the display component 116) is used to accommodate the alignment module 610, as well as the vision component 410. Also, the chassis 306 or a portion of the chassis 306 may be positioned below the display component 116 (in the Z-dimension). Accordingly, the chassis 306 may provide support to the display component 116 as well as other components.

Figure 5A:
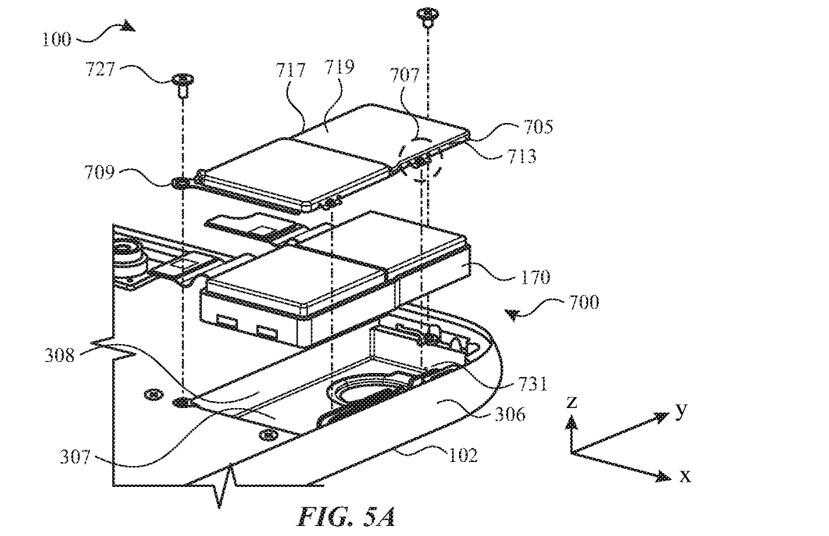
FIGS. 5A-5C illustrate isometric views of a shield assembly that can be included in the electronic device of FIG. 1, in accordance with some embodiments.
Figure 5B:
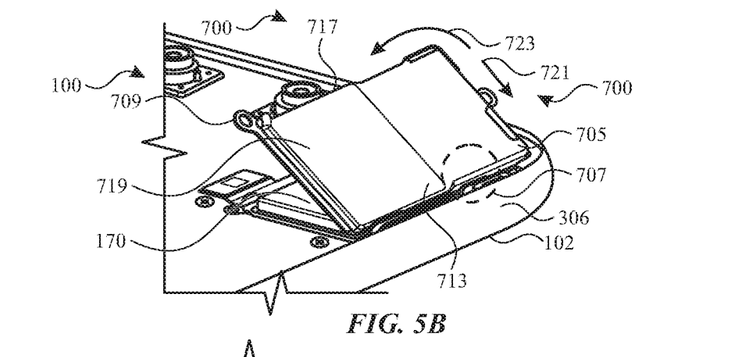
Figure 5C:
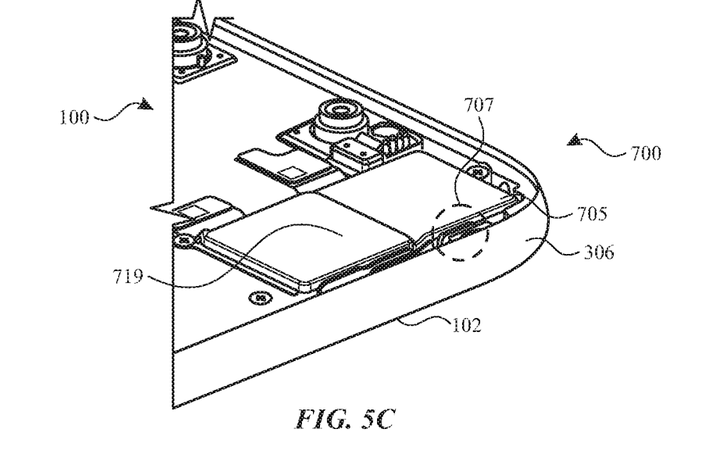

FIGS. 5A-5C show an example of a shield assembly 700, in accordance with some embodiments. FIG. 5A shows the shield assembly 700 in an unassembled configuration, FIG. 5B shows the shield assembly 700 in an intermediate stage of an assembly process, and FIG. 5C shows the shield assembly 700 in an assembled configuration.

The shield assembly 700 can be used for shielding electric field lines to and/or from an electronic component, such as a camera component 170, to mitigate electrical interference that can degrade performance of the electronic component and/or of one or more electronic components that may be disposed in a region around or near the electronic component. For example, it has been discovered that the camera component 170 can emit electric fields that can interfere with other electronic components, such as antennas, that can be disposed in an area or region near or proximate to the camera component 170. However, while examples are described with respect to camera component 170, it will be appreciated that teachings of the shield assembly 700 can generally be applied to any other feasible electronic component of an electronic device where the electronic component can create or be susceptible to electric field interference. For example, the teachings of the shield assembly 700 can be applied to any of the other electronic components described above with respect to FIGS. 1-4.

As shown in FIGS. 5A-5C, the shield assembly 700 can include a covering 705 and chassis 306, which can be assembled together to provide ground shielding around an electronic component. For example, the shield assembly 700 can include covering 705 mounted to the chassis 306 on or over the camera component 170. The covering 705 can generally be implemented as any conductive structure with any appropriate size or shape that permits the covering 705 to cover all or a substantial portion of the camera component 170 and/or the chamber 307. For example, the covering 705 can be assembled to cover the entire areal footprint of camera component 170 as shown in the illustrated example, or it can cover a substantial portion of camera component 170, such as a majority of the areal footprint of the camera component 170, depending on considerations such as the desired shielding or electric field interference that is permissible, or the relative position of other electronic components with respect to which shielding is desired. The areal footprint in this example is defined with respect to the area in the X-Y plane shown in FIG. 5A. The covering 705 can be implemented as a removable metal cowling or housing that covers the camera component 170 or other electronic component and serves to enclose the camera component 170 in the chamber 307 together with a wall or other structure of the chassis 306, such as the interior wall 308 and/or sidewall 102.

It is contemplated that the shield assembly 700 can facilitate an assembly process involving a toe-in installation of the covering 705 over the camera component 170. Although a toe-in assembly process is described, it will be appreciated that the teachings of the shield assembly 700 can be applied to other types of assembly techniques.

As shown for example in FIG. 5B, the covering 705 can include one or more retention features 707 disposed in a toe region of the covering 705, and one or more mounting features 709 disposed in a heel region of the covering 705 and/or any other region of the covering 705 outside of the toe region. To form a mechanical and electrical coupling between the chassis 306 and the covering 705, the toe-in assembly process can involve a first stage in which the covering 705 and the retention feature 707 are moved or translated in a first direction 721 with respect to the chassis 306 to slidably insert the retention feature 707 into a mounting fixture 731 of the chassis 306. This insertion can anchor the toe region to the chassis 306 and form a pivot point about which the covering 705 and the mounting feature 709 can be rotated.

The covering 705 is then moved or rotated in a second direction 723 to pivot the covering 705 about the toe region and position the heel region onto a remaining portion of the chassis 306 or electronic device 100. The covering 705 can then be further secured by affixing or attaching the mounting feature 709 to the chassis 306. For example, the mounting feature 709 is shown in FIG. 5A as a screw loop configured to accommodate a screw fastener for attaching a portion of the covering 705 to the interior wall 308 of the chassis 306 to enclose the camera component 170 within the chamber 307. Additionally or alternatively, it is contemplated that any other suitable fastener may be used. Examples of fasteners include adhesives, welds, and clamps.

With continued reference to the example shown in FIGS. 5A-5C, the toe region in general can be positioned substantially anywhere with respect to the covering 705 and corresponds to a portion of the covering 705 that is inserted in or coupled to the chassis 306 at a first stage prior to coupling of a remaining portion of the covering 705 to the chassis 306. The heel region in general can be positioned substantially anywhere with respect to the covering 705 that is opposite to the toe region and corresponds to a remaining portion of the covering 705 that is positioned on or otherwise coupled to the chassis 306 at a subsequent stage after the first stage.

For example as shown in FIGS. 5A-5B, the toe region includes or is disposed along a first edge 713 of the covering 705, and the heel region includes or is disposed along a second edge 717 of the covering 705 that is opposite to the first edge 713. A shield element 719 for blocking electromagnetic fields can be disposed between the first edge 713 and the second edge 717. The shield element 719 can be implemented as a conductive covering, such as a plate or plate-like region formed of a continuous conductive material or mesh of conductive material that extends across a substantial area so as to permit the shield element 719 to cover the camera component 170 and provide a shielding effect that blocks electromagnetic interference to and/or from the camera component 170.

FIG. 5C shows the shield assembly 700 in an assembled configuration. As shown for example in FIG. 5C, it is contemplated that the covering 705 can be implemented as both an electrical shielding feature as well as a mounting structure that serves to securely mount the camera component 170 in place. For example, the camera component 170 may be secured between the shield element 719 of the covering 705 and the chassis 306 when in an assembled configuration. As shown in FIG. 5A, the camera component 170 can be secured in a chamber 307 of the chassis 306 bordered by interior wall 308, where the covering 705 including shield element 719 serves to cover and enclose the chamber 307 together with the interior wall 308. For example, the fastener 727 can be attached to the interior wall 308 and utilized to secure the second edge 717 to the interior wall 308, while the retention feature 707 can be attached to the sidewall 102 and utilized to secure the first edge 713 to the first wall.

In some instances, a thickness of an electronic device 100 can be constrained. For example, considerations such as portability, aesthetic design, and/or a need for integration of multiple functional components may provide a constraint to the Z-height of the electronic device 100 defined with respect to the frame of reference shown in FIG. 5A. According to some embodiments, the retention feature 707 and/or the mounting fixture 731 can be implemented with a structure designed to facilitate both mechanical retention of the covering 705 and electrical coupling of the covering 705 to a grounding path in the chassis 306.

Figure 6A:
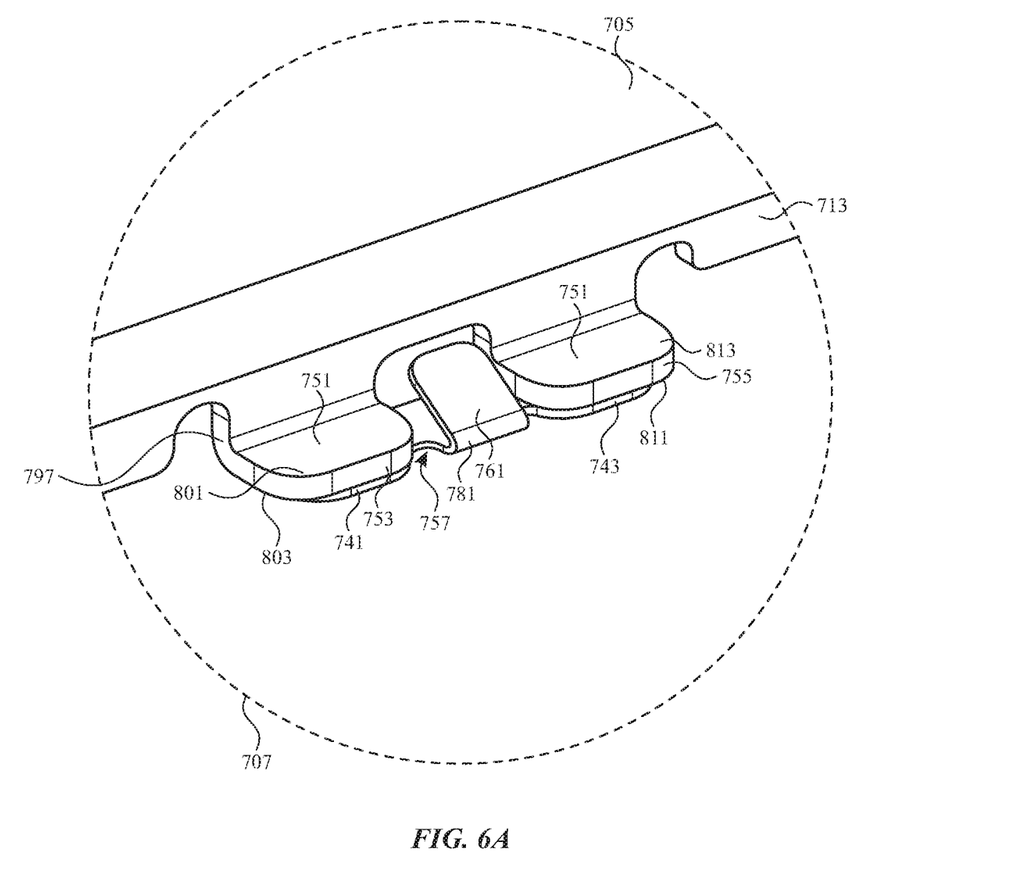
FIGS. 6A-6B illustrate enlarged views of components of the shield assembly of FIGS. 5A-5C, in accordance with some embodiments.
Figure 6B:
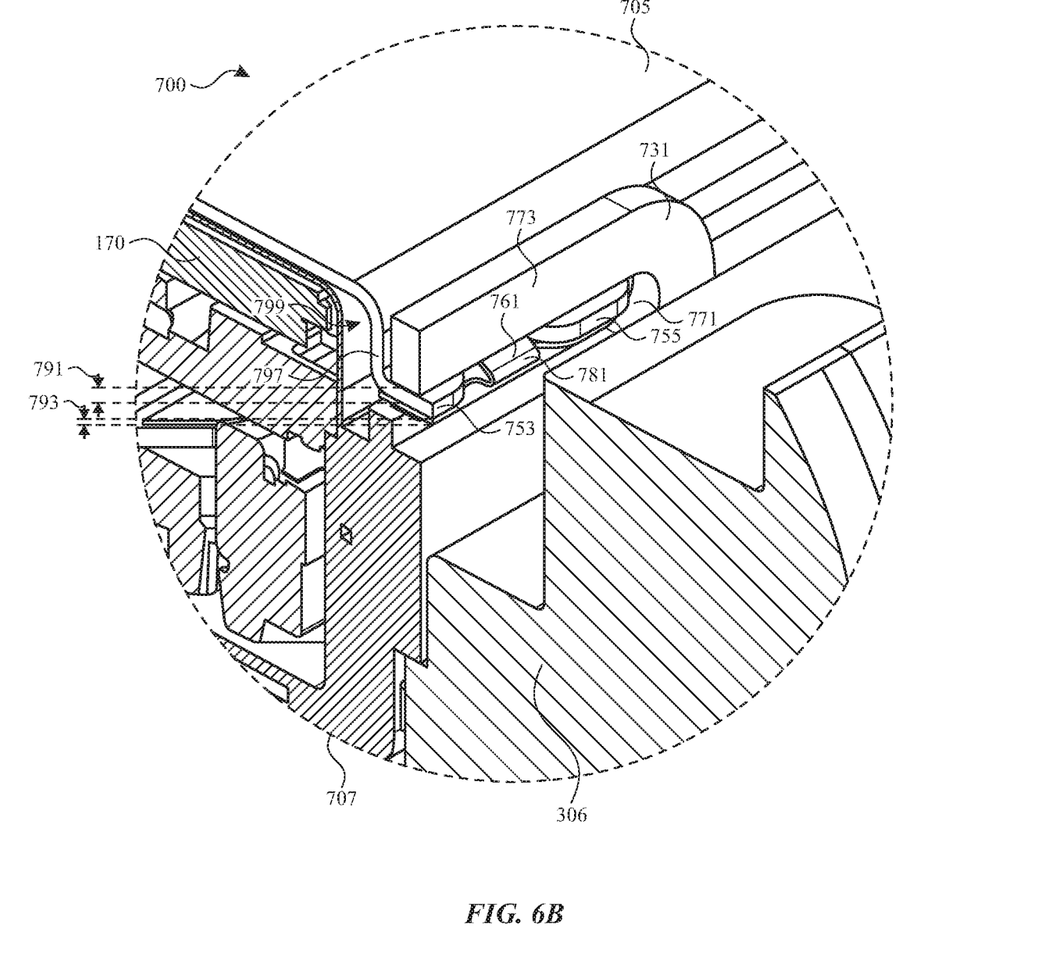

FIGS. 6A-6B show enlarged views of example of retention feature 707 that can be included on a covering 705. FIG. 6A shows the retention feature 707 in an unassembled configuration (e.g., as configured in FIG. 5A), while FIG. 7 shows the retention feature 707 in an assembled configuration as part of a shield assembly 700 (e.g., as configured in FIG. 6B).

With reference to the example shown in FIGS. 6A-6B, the retention feature 707 can include multiple tabs 751 including a first tab 753 and a second tab 755 spaced apart by a gap 757. Each of the tabs 751 including the first tab 753 and the second tab 755 can be physically and electrically connected to the shield element 719. For example, the first tab 753 and the second tab 755 can be integrally formed with the shield element 719 as part of a common metal plate, or the first tab 753 and the second tab 755 can be part of one or more separate metal pieces that are welded to or otherwise physically and electrically attached to the shield element 719. A spring contact 761 can be disposed in the gap 757 and electrically connected to the shield element 719 via one or more of the tabs 751. In the example shown, the spring contact 761 is electrically connected to the shield element 719 via both the first tab 753 and the second tab 755. Both the first tab 753 and the second tab 755 protrude from the first edge 713, which corresponds to an edge of the shield element 719 and can be used for toe-in insertion of the tabs 751 to chassis 306.

The retention feature 707 including the tabs 751 and spring contact 761 can be configured for insertion into a complementary feature of the mounting fixture 731 so that, when the tabs 751 and spring contact 761 are inserted into the mounting fixture 731, the tabs 751 can serve to provide mechanical retention of the covering 705 with respect to the chassis 306, while the spring contact 761 can serve to maintain electrical coupling contact between the covering 705 and the chassis 306. For example, the mounting fixture 731 can include a slot 771 surrounded by or otherwise adjacent to a rail 773, which can be a conductive structure of the chassis 306 that provides or is electrically connected to a grounding path, such as any suitable system ground, earth ground, or pseudo-ground plane. The mounting fixture 731, including the slot 771 and the rail 773, can be fixed to a wall of the chamber, such as sidewall 102 or interior wall 308. Both first tab 753 and the second tab 755 can be configured for insertion into the slot 771 so that the first tab 753 and the second tab 755 cooperate with and abut against the rail 773 to provide a mechanically robust coupling attachment between the retention feature 707 and the mounting fixture 731. The spring contact 761 disposed in the gap 757 between the tabs 751 can also be configured for insertion into the slot 771 so that the spring contact 761 cooperates with and contacts the rail 773 in a tensioned manner to maintain electrical contact between the retention feature 707 and the mounting fixture 731.

Although it is contemplated that other implementations may utilize any suitable arrangement in which a spring contact 761 cooperates with tabs 751 to form a mechanical and electrical coupling feature, the example shown in FIGS. 6A-6B utilizes an arrangement that allows the tabs 751 to maintain a sufficiently high sheet thickness for mechanical strength while the spring contact 761 can be formed sufficiently thin to maintain flexibility and avoid an overly stiff spring. In the illustrated example, the spring contact 761 is provided as part of a separate electrical contact attachment 781 that is attached to portions of the covering 705 to form the retention feature 707, where a sheet thickness 791 of a metal plate or structure of the tabs 751 is greater than a sheet thickness 793 of a metal plate or structure of the contact attachment 781.

The spring contact 761 and the contact attachment 781 can be implemented as a gold plated metal plate, or another conductive structure, that can be welded to or otherwise electrically and mechanically attached to the tabs 751. As used herein, "sheet thickness" refers to the thickness of a metal or conductive sheet from which the component is formed and can be further bent into a larger overall shape or size. For example, exemplary sheet thicknesses are shown in FIG. 6B, in which the sheet thickness of the bent portion of a metal sheet that forms the spring contact 761 is less than a sheet thickness of a stamped portion of the tabs 751, even though the metal sheet that forms the spring contact 761 is bent so that the spring contact 761 has an overall greater height or total vertical dimension relative to the tabs 751.

With continued reference to FIGS. 6A-6B, the contact attachment 781 can include a first portion 741 welded or otherwise attached to the first tab 753, such as a first protrusion extending from the spring contact 761 in a first direction, and a second portion 743 welded or otherwise attached to the second tab 755, such as a second protrusion extending from the spring contact 761 in a second direction opposite to the first direction. The contact attachment 781 can be secured to the tabs 751 in a manner that permits the spring contact 761 to extend through the gap 757 or portions of the gap 757. For example, each of the tabs 751 can have a top surface and a bottom surface with respect to the orientation of FIGS. 6A and 6B (which can be any arbitrary frame of reference), and the contact attachment 781 can be attached to a bottom side of the tabs to permit the spring contact 761 to extend through the gap 757 from the bottom side to the top side.

In particular, the first tab 753 can include a first tab bottom surface 803 and a first tab top surface 801 opposite to the first tab bottom surface, and the second tab 755 can include a second tab bottom surface 811 and a second tab top surface 813 opposite to the second tab bottom surface 811. The first portion 741 can be welded to the first tab bottom surface 803 and the second portion 743 can be welded to the second tab bottom surface 811, with the spring contact 761 between the first portion 741 and the second portion 743 oriented to extend upward through the gap 757 in a direction extending from a plane defined by the first tab bottom surface 803 and second tab bottom surface 811 towards and through a plane defined by the first tab top surface 801 and the second tab top surface 813.

It is contemplated that the covering 705 can be provided with a desired size, shape, or construction, as previously mentioned. In the example shown in FIGS. 6A-6B, the covering 705 includes a stamped metal plate or structure having a concave surface 799 configured to accommodate the camera component 170, or a portion of the camera component 170, therein, such that the concave surface 799 is recessed relative to the tabs 751 so that the concave surface 799 conforms to an exterior profile of the camera component 170. The tabs 751 can be implemented as stamped conductive tabs with an L-shaped cross-sectional shape 797 and disposed on an edge of the covering 705 in an area around or adjacent to the concave surface 799.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and magnets are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A covering for enclosing an electronic component in a chamber of a mobile communication device, the covering comprising:
    a shield element configured to cover the chamber;
    a first tab connected to the shield element;
    a second tab connected to the shield element and spaced apart from the first tab by a gap, wherein the first tab and the second tab are insertable into a slot to retain the shield element over the chamber; and
    a spring contact disposed in the gap and electrically connected to the shield element via at least one of the first tab or the second tab, wherein the spring contact is configured to contact a rail adjacent to the slot to electrically ground the shield element.

2. The covering of claim 1, wherein the spring contact is part of a metal plate having a sheet thickness less than a sheet thickness of each of the first tab and the second tab.

3. The covering of claim 1, wherein the spring contact is part of an electrical contact attachment that includes a first portion attached to the first tab and a second portion attached to the second tab.

4. The covering of claim 3, wherein:
    the first tab has a first tab bottom surface and a first tab top surface opposite to the first tab bottom surface;
    the second tab has a second tab bottom surface and a second tab top surface opposite to the second tab bottom surface;
    the first portion of the electrical contact attachment is welded to the first tab bottom surface;
    the second portion of the electrical contact attachment is welded to the second tab bottom surface; and
    the spring contact extends from a plane defined by the first tab bottom surface and the second tab bottom surface through a plane defined by the first tab top surface and the second tab top surface.

5. The covering of claim 1, wherein the first tab and the second tab are configured to slide within a slot fixed to a wall of the chamber.

6. The covering of claim 1, wherein the shield element is a metal covering having an edge, and wherein the first tab and the second tab protrude from the edge.

7. The covering of claim 6, wherein the edge is a first edge and the covering further comprises a fastener attached to a second edge of the metal covering opposite the first edge.

8. A covering comprising:
    a conductive plate having an edge;
    a first tab and a second tab protruding from the edge and spaced apart from each other by a gap; and
    a spring contact disposed in the gap and electrically connected to the conductive plate.

9. The covering of claim 8, further comprising:
    a screw loop fixed to the edge of the conductive plate,
    wherein the first tab and the second tab protrude from a first side of the conductive plate, and
    wherein the screw loop is fixed to a second side of the conductive plate different from the first side.

10. The covering of claim 8, wherein each of the first tab and the second tab is implemented as a stamped conductive tab having an L-shaped cross sectional shape.

11. The covering of claim 8, wherein the spring contact is formed of a bent portion of a metal plate in which the metal plate has a sheet thickness less than a sheet thickness of each of the first tab and the second tab.

12. The covering of claim 11, wherein the metal plate comprises a first protrusion attached to the first tab and a second protrusion attached to the second tab, wherein the bent portion is positioned between the first protrusion and the second protrusion and extends through the gap.

13. The covering of claim 11, wherein the metal plate is gold plated.

14. A mobile communication device, comprising:
a chassis having a slot and a rail adjacent to the slot;
a first electronic component mounted to the chassis;
a covering enclosing the first electronic component within a chamber, the covering having multiple tabs inserted into the slot and a shield element electrically connected to the rail via a spring contact in the slot; and
one or more second electronic components mounted to the chassis outside the chamber.

15. The mobile communication device of claim 14, wherein the first electronic component comprises a camera.

16. The mobile communication device of claim 15, wherein the one or more second electronic components comprise an antenna.

17. The mobile communication device of claim 14, wherein the chassis comprises at least one wall at least partially surrounding the chamber.

18. The mobile communication device of claim 17, wherein the at least one wall comprises a first wall on one side of the chamber and a second wall on a different side of the chamber, wherein the slot and the rail are fixed to the first wall, wherein the multiple tabs are slidably inserted into the slot, and wherein the covering is fixed to the second wall via a fastener.

19. The mobile communication device of claim 14, wherein spring contact is formed of a metal plate welded to the multiple tabs and having a bent portion between the multiple tabs, wherein the metal plate has a sheet thickness less than a sheet thickness of each of the multiple tabs.

20. The mobile communication device of claim 14, wherein the covering has a concave surface conforming to an exterior profile of the first electronic component.

* * * * *